United States Patent
Byun

(10) Patent No.: US 7,656,207 B2
(45) Date of Patent: Feb. 2, 2010

(54) DELAY LOCKED LOOP CIRCUIT HAVING COARSE LOCK TIME ADAPTIVE TO FREQUENCY BAND AND SEMICONDUCTOR MEMORY DEVICE HAVING THE DELAY LOCKED LOOP CIRCUIT

(75) Inventor: Young-yong Byun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 22 days.

(21) Appl. No.: 12/009,080

(22) Filed: Jan. 16, 2008

(65) Prior Publication Data

US 2008/0180149 A1 Jul. 31, 2008

(30) Foreign Application Priority Data

Jan. 17, 2007 (KR) ............... 10-2007-0005438

(51) Int. Cl.
*H03L 7/06* (2006.01)
(52) U.S. Cl. ............... 327/158; 327/147; 327/156; 327/149
(58) Field of Classification Search ........... 327/147, 327/149, 156, 158
See application file for complete search history.

(56) References Cited

U.S. PATENT DOCUMENTS

| | | | | |
|---|---|---|---|---|
| 6,774,690 | B2 * | 8/2004 | Baker et al. ............... | 327/158 |
| 6,803,826 | B2 * | 10/2004 | Gomm et al. ............... | 331/11 |
| 6,847,241 | B1 * | 1/2005 | Nguyen et al. ............. | 327/158 |
| 6,906,566 | B2 | 6/2005 | Drexler | |
| 6,959,062 | B1 * | 10/2005 | Stubbs ...................... | 375/376 |
| 6,986,072 | B2 | 1/2006 | Nishio et al. | |
| 7,035,366 | B2 | 4/2006 | Tokutome et al. | |
| 7,057,431 | B2 | 6/2006 | Kwak | |
| 7,057,432 | B2 * | 6/2006 | Yoo et al. .................. | 327/158 |
| 7,274,239 | B2 * | 9/2007 | Lin ........................... | 327/277 |
| 7,421,606 | B2 * | 9/2008 | Kim .......................... | 713/401 |
| 7,459,949 | B2 * | 12/2008 | Mai .......................... | 327/158 |
| 7,468,616 | B1 * | 12/2008 | Kondapalli et al. ........... | 326/82 |
| 2003/0012321 | A1 | 1/2003 | Tokutome et al. | |
| 2003/0025540 | A1 | 2/2003 | Nishio et al. | |
| 2003/0219088 | A1 | 11/2003 | Kwak | |
| 2005/0195663 | A1 | 9/2005 | Kwak | |
| 2005/0262373 | A1 * | 11/2005 | Kim .......................... | 713/401 |

(Continued)

FOREIGN PATENT DOCUMENTS

JP         2003-32104         1/2003

(Continued)

*Primary Examiner*—Lincoln Donovan
*Assistant Examiner*—Adam D Houston
(74) *Attorney, Agent, or Firm*—Mills & Onello, LLP

(57) ABSTRACT

Provided are a DLL circuit having a coarse lock time adaptive to a frequency band of an external clock signal and a semiconductor memory device having the DLL circuit. The DLL circuit includes a delay circuit, a replica circuit, and a phase detector. The phase detector generates a first comparison signal used by the delay circuit to delay an external clock signal in units of a first cell delay time or a second comparison signal used by the delay circuit to delay the external clock signal in units of a second cell delay time. The DLL circuit delays the external clock signal by the cell delay time adaptive to the frequency band of the external clock signal, and thus can perform an accurate and rapid coarse lock operation for the entire frequency band.

20 Claims, 4 Drawing Sheets

U.S. PATENT DOCUMENTS

| | | | |
|---|---|---|---|
| 2006/0017480 A1* | 1/2006 | Lin | 327/158 |
| 2006/0273836 A1* | 12/2006 | Lin | 327/158 |
| 2008/0100357 A1* | 5/2008 | Bae | 327/158 |
| 2008/0136485 A1* | 6/2008 | Takai et al. | 327/263 |
| 2008/0136799 A1* | 6/2008 | Nakamura | 345/204 |
| 2008/0320325 A1* | 12/2008 | Kim | 713/401 |
| 2009/0028281 A1* | 1/2009 | Chulwoo et al. | 375/374 |
| 2009/0146716 A1* | 6/2009 | Ide et al. | 327/276 |

FOREIGN PATENT DOCUMENTS

| | | |
|---|---|---|
| KR | 20030011677 | 2/2003 |
| KR | 20030090129 | 11/2003 |
| KR | 1020040093819 | 11/2004 |
| KR | 10-2005-0089474 | 9/2005 |

* cited by examiner

| PD_F | PD_FD2 | PD_FD1 | XCOM |
|---|---|---|---|
| 0 | 0 | 0 | XCOM2 |
| 0 | 0 | 1 | XCOM1 |
| 0 | 1 | 1 | FINE LOCK ENABLE SIGNAL |
| 1 | 0 OR 1 | 0 OR 1 | INVERSION ENABLE SIGNAL |

DELAY LOCKED LOOP CIRCUIT HAVING COARSE LOCK TIME ADAPTIVE TO FREQUENCY BAND AND SEMICONDUCTOR MEMORY DEVICE HAVING THE DELAY LOCKED LOOP CIRCUIT

CROSS-REFERENCE TO RELATED PATENT APPLICATION

This application claims the benefit of Korean Patent Application No. 10-2007-0005438, filed on Jan. 17, 2007, in the Korean Intellectual Property Office, the contents of which are incorporated herein in their entirety by reference.

BACKGROUND OF THE INVENTION

1. Field of the Invention

The present invention relates to a semiconductor memory device, and more particularly, to a delay locked loop (DLL) circuit having a coarse lock time which adapts to a frequency band of an external clock signal by delaying the external clock signal by different cell delay times, and a semiconductor memory device having the DLL circuit.

2. Description of the Related Art

Synchronous semiconductor memory devices use a synchronization circuit for accurately synchronizing the phase of an internal clock signal with the phase of an external clock signal in order to prevent degradation of high-frequency operation performance. In general, a DLL circuit is used as the synchronization circuit for the synchronous semiconductor memory devices.

FIG. 1 is a block diagram of a conventional DLL circuit.

Referring to FIG. 1, a DLL circuit 100 includes a buffer 150, a delay circuit 110, a replica circuit 130, and a phase detector 140.

The buffer 150 buffers an external clock signal CLK. In response to a comparison signal XCOM, the delay circuit 110 generates an internal clock signal ICLK that is obtained by delaying an output signal of the buffer 150 by a predetermined time. The delay circuit 110 has a plurality of delay cells (not illustrated) that are connected in series.

The replica circuit 130 delays the internal clock signal ICLK by a data-path delay time, which is the time taken for the output data of a memory (not illustrated) to be outputted through a data path to an output pad, in response to the external clock signal CLK. The phase detector 140 generates the comparison signal XCOM corresponding to a phase difference between the external clock signal CLK and an output signal DQ_R of the replica circuit 130.

FIG. 2 is a timing diagram illustrating the conditions for transition from coarse lock to fine lock in the conventional DLL circuit illustrated in FIG. 1. In FIG. 2, DQ_R denotes an output signal of the replica circuit 130 and DQD_R denotes a signal that is obtained by delaying the output signal DQ_R by a predetermined time.

Referring to FIG. 2, the DLL circuit 100 compares the external clock signal CLK, the signal DQD_R, and the output signal DQ_R to perform a coarse lock operation. When a rising edge of the external clock signal CLK is in a lock window TW, the DLL circuit 100 performs a coarse lock operation. On the other hand, when a rising edge of the external clock signal CLK is not in a lock window TW, the DLL circuit 100 ends a coarse lock operation and starts a fine lock operation.

That is, when a rising edge of the external clock signal CLK is in a lock window TW (denoted by B), the DLL circuit 100 generates an ENDSTAGE signal to transition into a fine lock mode. On the other hand, when a rising edge of the external clock CLK is not in a lock window TW (denoted by A), the DLL circuit 100 further delays the internal clock signal ICLK by one delay cell (1 cell delay).

The lock window TW denotes a delay difference between the signal DQD_R and the output signal DQ_R. The ratio of a coarse lock time to a fine lock time changes depending on the size of the lock window TW. That is, when the size of the lock window TW increases, the coarse lock time decreases and the fine lock time increases. On the other hand, when the size of the lock window TW decreases, the coarse lock time increases and the fine lock time decreases.

In general, a DLL circuit for a memory system is designed to be optimal for a high-frequency operation. That is, a DLL circuit optimized for a high-frequency operation is designed to have a narrow lock window. However, because a DLL circuit for a memory device operates in a wide frequency band, the use of the DLL circuit optimized for the high-frequency operation increases a coarse lock time for a low frequency, which may lead to a shortage of the lock time.

In addition, because the DLL circuit optimized for the high-frequency operation is designed to have a small cell delay, a long time is taken for the coarse lock for the low frequency.

SUMMARY OF THE INVENTION

The present invention provides a DLL circuit and a semiconductor memory device having the DLL circuit, which can perform a coarse lock operation adaptive to a frequency band of an external clock signal to reduce a coarse lock time.

According to an aspect of the present invention, there is provided a DLL circuit including a delay circuit comprising a plurality of delay cells and delaying an external clock signal by a predetermined time in response to a comparison signal to generate an internal clock signal; a replica circuit outputting a first signal that is obtained by delaying the internal clock signal by a data-path delay time; and a phase detector generating the comparison signal corresponding to a phase difference between the external clock signal and the first signal, wherein the phase detector generates a first comparison signal used by the delay circuit to delay the external clock signal in units of a first cell delay time or a second comparison signal used by the delay circuit to delay the external clock signal in units of a second cell delay time.

The phase detector may output one of the first comparison signal and the second comparison signal according to the frequency band of the external clock signal.

The first cell delay time may be a delay time corresponding to one delay cell and may be used when the external clock signal is a high-frequency signal.

The second cell delay time may be a delay time corresponding to a plurality of delay cells and may be used when the external clock signal is a low-frequency signal.

The phase detector may include a first comparator comparing the phase of the external clock signal with the phase of the first signal; a second comparator comparing the phase of the external clock signal with the phase of a second signal that is obtained by delaying the first signal by a first delay time; and a third comparator comparing the phase of the external clock signal with the phase of a third signal that is obtained by delaying the first signal by a second delay time that is longer than the first delay time.

The first comparator may receive the external clock signal as a non-inverting input and the first signal as an inverting input, the second comparator may receive the external clock signal as a non-inverting input and the second signal as an inverting input, and the third comparator may receive the external clock signal as a non-inverting input and the third signal as an inverting input.

The phase detector may further include a first delayer delaying the first signal to obtain the second signal; and a second delayer delaying the first signal to obtain the third signal.

The first delayer may include a number of inverters which have a combined time delay corresponding to the first delay time and the second delayer may include another number of inverters which have a combined time delay corresponding to the second delay time.

When a phase difference between the first signal and the second signal is a first window, the size of the first window may be equal to or smaller than one half of the period of the external clock signal.

When a phase difference between the first signal and the third signal is a second window, the size of the second window may be equal to or greater than the first cell delay time.

The phase detector may further include a comparison signal generator generating one of the first comparison signal and the second comparison signal according to the logic levels of the first, second and third signals.

Each of the first, second, and third comparators may output a second logic level of a corresponding signal, when the corresponding signal has a first logic level at a rising edge of the external clock signal.

The phase detector may generate the first comparison signal when the output signals of the first and third comparators have the second logic level and the output signal of the second comparator has the first logic level, and may generate the second comparison signal when the output signals of the first, second and third comparators have the second logic level.

The phase detector may output a fine lock enable signal for commanding a fine lock operation to be performed when the output signal of the first comparator has the second logic level and the output signals of the second and third comparators have the first logic level.

The delay circuit may include a delay chain comprising a plurality of delay cells connected in series to each other and outputting a signal of an output node corresponding to a control signal, among output nodes between the delay cells adjacent to each other, as the internal clock signal; and a controller transferring the control signal to the delay chain in response to the comparison signal.

The controller may include a plurality of shift registers corresponding respectively to the delay cells and connected in series to each other; first connections connecting the shift registers adjacent to each other; and a second connection connecting the shift registers spaced apart from each other.

The first connections may include switches turned on in response to the first comparison signal, and the second connection may include switches turned on in response to the second comparison signal.

The switches of the first connections may be sequentially enabled in response to the first comparison signal.

The second connection may connect the shift registers spaced apart from each other by a plurality of delay cells which cause the second cell delay time.

According to another aspect of the present invention, there is provided a semiconductor memory device including the above-described DLL circuit.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention will now be described more fully with reference to the accompanying drawings, in which exemplary embodiments of the invention are shown.

Figure 1:
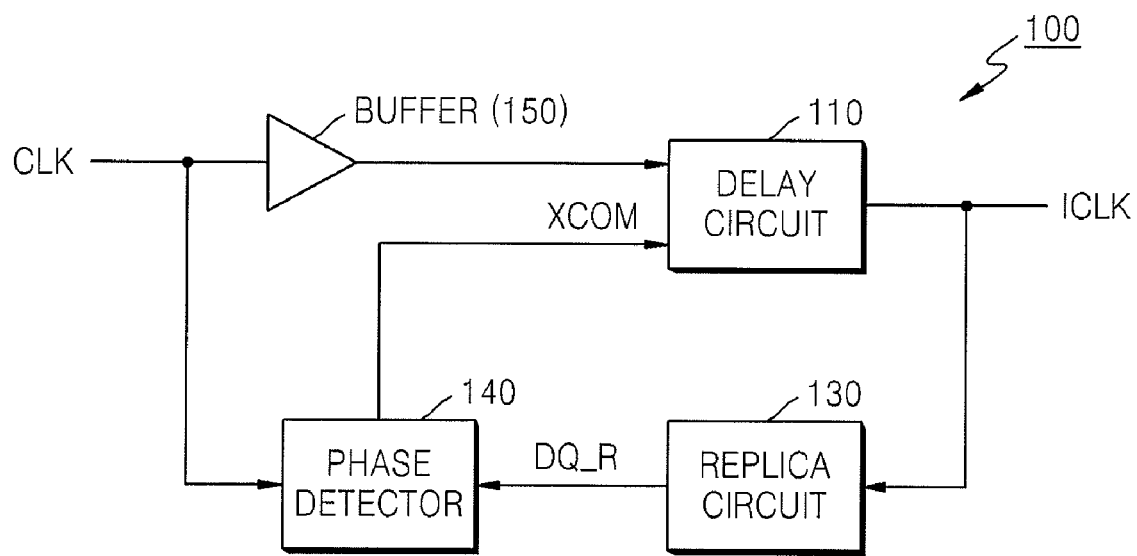
FIG. 1 is a block diagram of a conventional DLL circuit.
Figure 2:
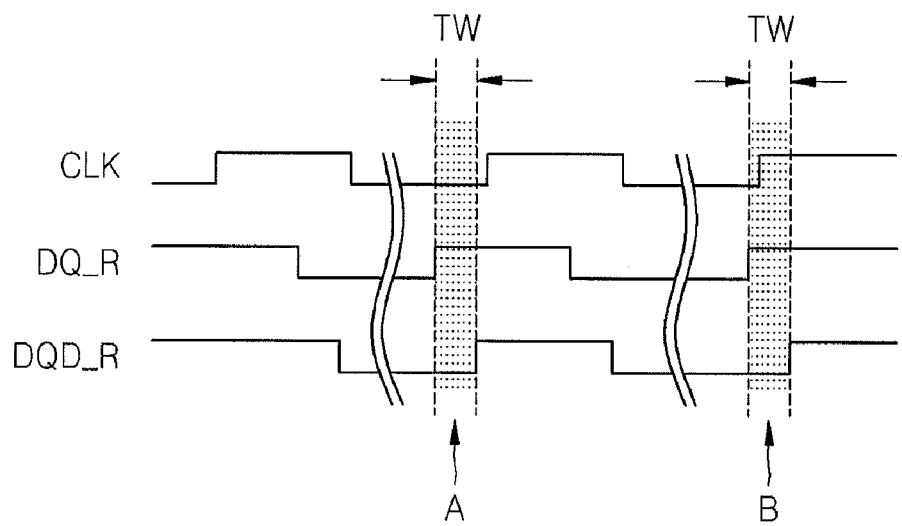
FIG. 2 is a timing diagram illustrating the conditions for transition from coarse lock to fine lock in the conventional DLL circuit illustrated in FIG. 1.

A basic operation of a DLL circuit according to an embodiment of the present invention is the same as illustrated in FIG. 1, and thus its detailed description will be omitted for conciseness.

Figures 3, 4:
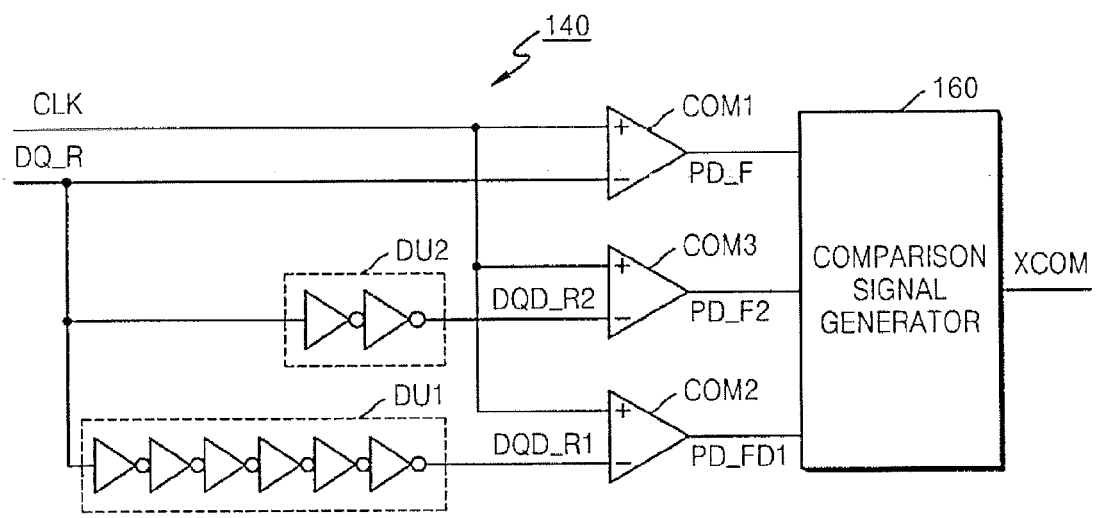
FIG. 3 is a circuit diagram of a phase detector according to an embodiment of the present invention.
FIG. 4 is a table illustrating a comparison signal XCOM that results from a combination of output signals of first, second and third comparators illustrated in FIG. 3.

FIG. 3 is a circuit diagram of a phase detector 140 according to an embodiment of the present invention.

Referring to FIGS. 1 and 3, the phase detector 140 according to an embodiment of the present invention generates one of a first comparison signal and a second comparison signal as the comparison signal XCOM. The first comparison signal is used by the delay circuit 110 to delay the external clock signal CLK in units of a first cell delay time, while the second comparison signal is used by the delay circuit 110 to delay the external clock signal CLK in units of a second cell delay time.

The first cell delay time is used when the external clock signal CLK is a high-frequency signal, which corresponds to the time delay caused by one delay cell (not illustrated). On the other hand, the second cell delay time is used when the external clock signal CLK is a low-frequency signal, which corresponds to the time delay caused by a plurality of delay cells. That is, a DLL circuit 100 according to an embodiment of the present invention delays the external clock signal CLK by different cell delay times in adaptation to a frequency band of the external clock signal CLK.

Accordingly, it is possible to solve the conventional problem that a long lock time is taken to delay a low-frequency signal by the cell delay time optimized for a high-frequency signal.

A description will now be given of an operation of the DLL circuit 100 for generating different cell delay times in response to the frequency band of the external clock signal CLK.

Referring again to FIGS. 1 and 3, the phase detector 140 includes a first comparator COM1, a second comparator COM2, and a third comparator COM3. The first comparator COM1 compares the phase of the external clock signal CLK with the phase of a first signal DQ_R, the second comparator COM2 compares the phase of the external clock signal CLK with the phase of a second signal DQD_R1, and the third comparator COM3 compares the phase of the external clock signal CLK with the phase of a third signal DQD_R2.

The first comparator COM1 receives the external clock signal CLK as a non-inverting input and the first signal DQ_R as an inverting input. The second comparator COM2 receives the external clock signal CLK as a non-inverting input and the second signal DQD_R1 as an inverting input. The third comparator COM3 receives the external clock signal CLK as a non-inverting input and the third signal DQD_R2 as an inverting input. When the external clock signal is "0" and the first/second/third signal DQ_R/DQD_R1/DQD_R2 is toggled to "1", the first/second/third comparator COM1/COM2/COM3 outputs "0". On the other hand, when the external clock signal is "1" and the first/second/third signal DQ_R/DQD_R1/DQD_R2 is toggled to "1", the first/second/third comparator COM1/COM2/COM3 outputs "1". Accordingly, the first/second/third comparator COM1/COM2/COM3 outputs a corresponding output signal PD_F/PD_FD1/PD_FD2 as "0" or "1".

The first signal DQ_R is an output signal of a replica circuit 130. The second signal DQD_R1 is obtained by delaying the first signal DQ_R by the first delay time. The third signal DQD_R2 is obtained by delaying the first signal DQ_R by the second delay time. The first delay time is longer than the second delay time as described above.

The phase detector 140 further includes a first delayer DU1 for delaying the first signal DQ_R to obtain the second signal DQD_R1 and a second delayer DU2 for delaying the first signal DQ_R to obtain the third signal DQD_R2. The first delayer DU1 has a number of inverters whose combined time delay corresponds to the first delay time, while the second delayer DU2 has a number of inverters whose combined time delay corresponds to the second delay time.

The phase detector 140 having the above construction and operation generates one of the first comparison signal and the second comparison signal according to the logic levels of the first, second and third signals DQ_R, DQD_R1 and DQD_R2 at a rising edge of the external clock signal CLK. At this point, the logic level of the first/second/third signal DQ_R/DQD_R1/DQD_R2 at the rising edge of the external clock signal CLK corresponds to the output signal PD_F/PD_FD1/PD_FD2 of the first/second/third comparator COM1/COM2/COM3.

For example, when the first/second/third signal DQ_R/DQD_R1/DQD_R2 at the rising edge of the external clock signal CLK has a first logic level, the first/second/third comparator COM1/COM2/COM3 outputs a signal with a second logic level. Hereinafter, the first logic level and the second logic level will be respectively referred to as logic high "H" and logic low "L".

The phase detector 140 further includes a comparison signal generator 160 for generating the first comparison signal and the second comparison signal that result, as illustrated in FIG. 4.

FIG. 4 is a table illustrating the comparison signal XCOM that results from a combination of the output signals PD_F, PD_FD1 and PD_FD2 of the first, second and third comparators COM1, COM2 and COM3 illustrated in FIG. 3.

Referring to FIGS. 3 and 4, when the output signals. PD_F and PD_FD2 of the first and third comparators COM1 and COM3 are logic low "L" and the output signal PD_FD1 of the second comparator COM2 is logic high "H", the phase detector 140 generates a first comparison signal XCOM1 as the comparison signal XCOM. On the other hand, when the output signals PD_F, PD_FD1 and PD_FD2 of the first, second and third comparators COM1, COM and COM3 are logic low "L", the phase detector 140 generates a second comparison signal XCOM2 as the comparison signal XCOM.

When the output signal PD_F of the first comparator COM1 is logic low "L" and the output signals PD_FD1 and PD_FD2 of the second and third comparators COM2 and COM3 are logic high "H", the phase detector 140 outputs a fine lock enable signal as the comparison signal XCOM for ordering a fine lock operation to be performed. On the other hand, when the output signal PD_F of the first comparator COM1 is logic low "H", the phase detector 140 outputs an inversion lock enable signal as the comparison signal XCOM for ordering an inversion lock operation to be performed.

Figure 5:
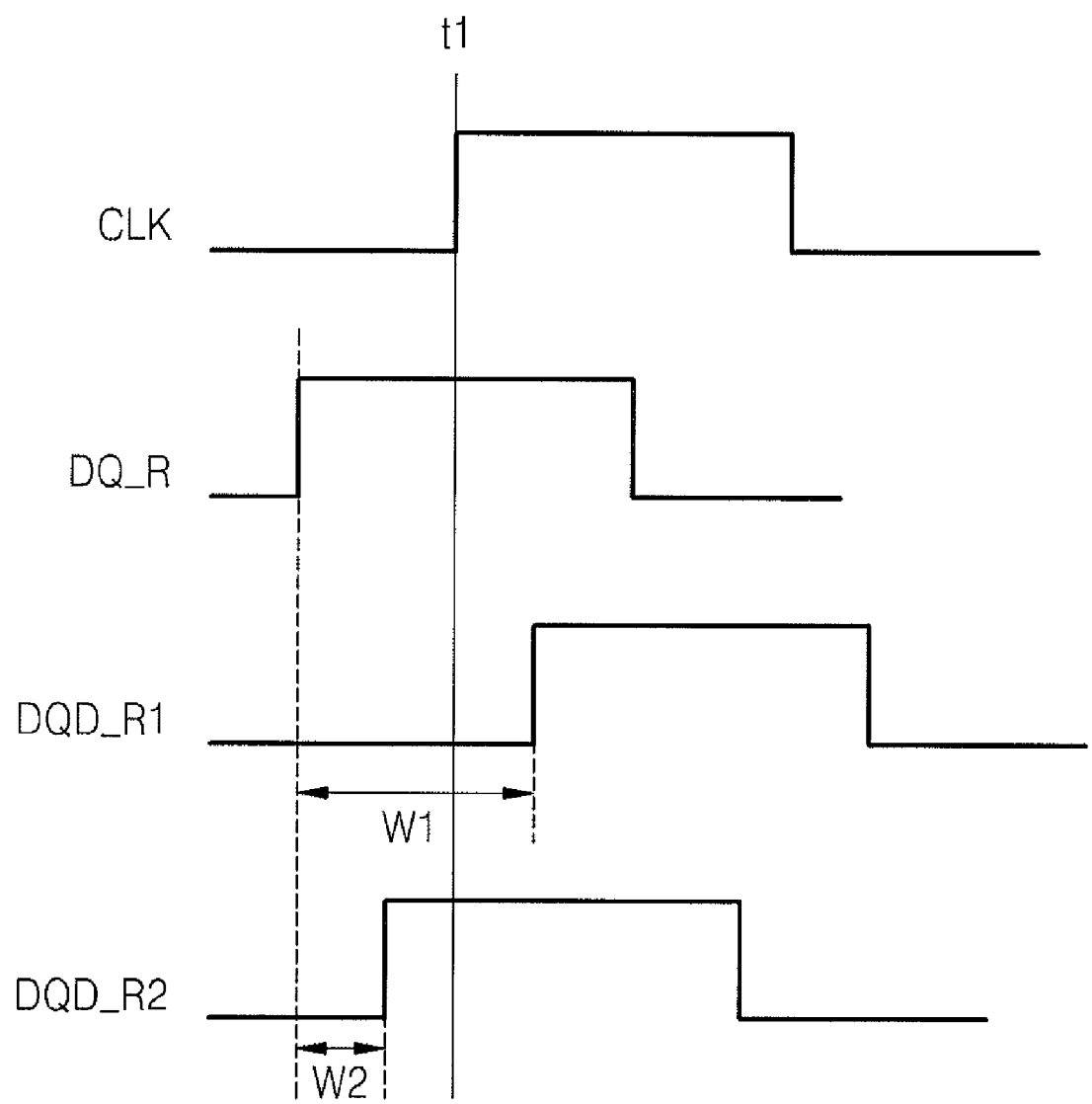
FIGS. 5 and 6 are timing diagrams corresponding to the table of FIG. 4.
Figure 6:
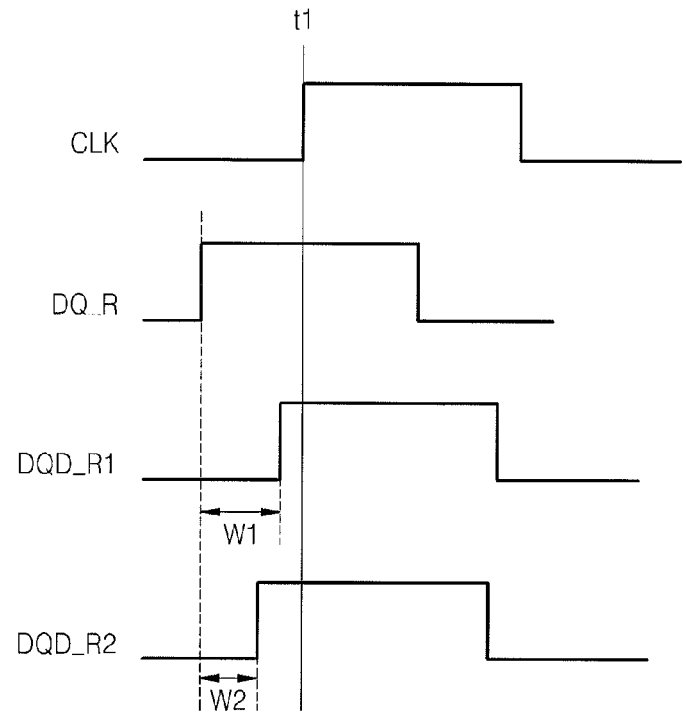

FIGS. 5 and 6 are timing diagrams corresponding to the table of FIG. 4. FIG. 5 is a timing diagram corresponding to the case where the first comparison signal XCOM1 is outputted as the comparison signal, while FIG. 6 is a timing diagram corresponding to the case where the second comparison signal XCOM2 is outputted as the comparison signal XCOM.

Referring to FIGS. 3 through 6, when a phase difference between the first signal DQ_R and the second signal DQD_R1 is referred to as a first window W1, the size of the first window W1 is designed to be equal to or smaller than ½ of the period of the external clock signal CLK. In addition, when a phase difference between the first signal DQ_R and the third signal DQD_R2 is referred to as a second window W2, the size of the second window W2 is designed to be equal to or greater than the first cell delay time. Accordingly, the DLL circuit according to the embodiment of the present invention can operate at an accurate lock time.

Referring to FIG. 5, at a rising edge t1 of the external clock signal CLK, the first and third signals DQ_R and DQD_R2 are logic high "H" and the second signal DQD_R1 is logic low "L". During this period, the phase detector 140 outputs the first comparison signal XCOM1 as the comparison signal XCOM and the delay circuit 110 delays the external clock signal CLK by a delay time corresponding to a time delay caused by one delay cell in response to the first comparison signal XCOM1.

Referring to FIG. 6, at a rising edge t1 of the external clock signal CLK, the first, second and third signals DQ_R, DQD_R1 and DQD_R2 are logic high "H". During this period, the phase detector 140 outputs the second comparison signal XCOM2 as the comparison signal XCOM and the delay circuit 110 delays the external clock signal CLK by a delay time corresponding to a time delay caused by a plurality of delay cells in response to the second comparison signal XCOM2.

Figure 7:
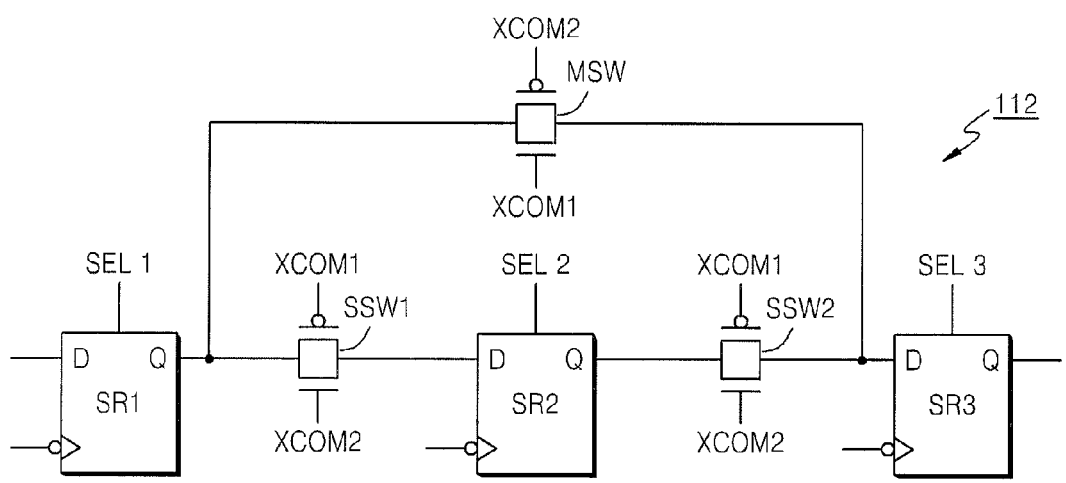
FIG. 7 is a circuit diagram illustrating an operation of a delay circuit according to an embodiment of the present invention.

FIG. 7 is a circuit diagram illustrating an operation of the delay circuit 110 according to an embodiment of the present invention.

Referring to FIGS. 1 and 7, the delay circuit 110 includes a controller 112 and a delay chain (not illustrated). The delay chain includes a plurality of delay cells that are connected in series to each other. The delay chain outputs a signal of an output node corresponding to a control signal SEL1/SEL2/SEL3, among output nodes between the delay cells adjacent to each other, as an internal clock signal ICLK. The controller 112 transfers the control signal SEL1/SEL2/SEL3 to the delay chain in response to the comparison signal XCOM. A basic operation of the delay circuit 110 is well known to those skilled in the art, and thus its detailed description will be omitted for conciseness.

The controller 112 according to an embodiment of the present invention includes a plurality of shift registers SR1, SR2 and SR3 that correspond respectively to the delay cells and are connected in series to each other. The shift registers which are adjacent to each other (SR1-SR2 and SR2-SR3) are connected to each other (first connections), and the shift registers which are spaced apart from each other (SR1-SR3) are connected to each other (a second connection).

The first connection is enabled when the external clock signal CLK is delayed by a delay time corresponding to a time delay caused by one delay cell in response to the first comparison signal XCOM1 as illustrated in FIG. 5. That is, the shift registers SR1, SR2 and SR3 of the first connection are sequentially enabled in response to the first comparison signal XCOM1.

On the other hand, the second connection is enabled when the external clock signal CLK is delayed by a delay time corresponding to a time delay caused by a plurality of delay cells in response to the second comparison signal XCOM2 as illustrated in FIG. 6. FIG. 7 illustrates the second connection that connects the shift registers SR1 and SR3 that are spaced apart from each other by two delay cells which cause the second cell delay time.

For the above operation, the first connections have switches SSW1 and SSW2 that are turned on in response to the first comparison signal XCOM1 and the second connection has a switch MSW that is turned on in response to the second comparison signal XCOM2. At this point, the second comparison signal XCOM2 is an inversion of the first comparison signal XCOM1.

The DLL circuit according to the embodiment of the present invention changes the cell delay time in adaptation to the frequency band of the external clock signal by using the controller of FIG. 7, and thus can be optimized for the entire frequency band.

As described above, the DLL circuit of the semiconductor memory device according to the present invention delays the external clock signal by the cell delay time adaptive to the frequency band of the external clock signal, and thus can perform an accurate and rapid coarse lock operation for the entire frequency band.

While the present invention has been particularly shown and described with reference to exemplary embodiments thereof it will be understood by those of ordinary skill in the art that various changes in form and details may be made therein without departing from the spirit and scope of the present invention as defined by the following claims.

What is claimed is:

1. A DLL (delay locked loop) circuit comprising:
a delay circuit comprising a plurality of delay cells and delaying an external clock signal by a predetermined time in response to a comparison signal to generate an internal clock signal;
a replica circuit outputting a first signal that is obtained by delaying the internal clock signal by a data-path delay time; and
a phase detector generating the comparison signal corresponding to a phase difference between the external clock signal and the first signal,
wherein the phase detector generates a first comparison signal used by the delay circuit to delay the external clock signal in units of a first cell delay time or a second comparison signal used by the delay circuit to delay the external clock signal in units of a second cell delay time,
wherein the delay circuit comprises a plurality of shift registers corresponding respectively to the delay cells and being connected in series, and
wherein the units of the first cell delay time are generated by first connections connecting the shift registers adjacent to each other, and the units of the second cell delay time are generated by a second connection connecting the shift registers spaced apart from each other.

2. The DLL circuit of claim 1, wherein the phase detector outputs one of the first comparison signal and the second comparison signal according to the frequency band of the external clock signal.

3. The DLL circuit of claim 2, wherein the first cell delay time is a delay time corresponding to one delay cell and is used when the external clock signal is a high-frequency signal.

4. The DLL circuit of claim 2, wherein the second cell delay time is a delay time corresponding to a plurality of delay cells and is used when the external clock signal is a low-frequency signal.

5. The DLL circuit of claim 1, wherein the phase detector comprises:
a first comparator comparing the phase of the external clock signal with the phase of the first signal;
a second comparator comparing the phase of the external clock signal with the phase of a second signal that is obtained by delaying the first signal by a first delay time; and
a third comparator comparing the phase of the external clock signal with the phase of a third signal that is obtained by delaying the first signal by a second delay time that is longer than the first delay time.

6. The DLL circuit of claim 5, wherein the first comparator receives the external clock signal as a non-inverting input and the first signal as an inverting input, the second comparator receives the external clock signal as a non-inverting input and the second signal as an inverting input, and the third comparator receives the external clock signal as a non-inverting input and the third signal as an inverting input.

7. The DLL circuit of claim 5, wherein the phase detector further comprises:
a first delayer delaying the first signal to obtain the second signal; and
a second delayer delaying the first signal to obtain the third signal.

8. The DLL circuit of claim 7, wherein the first delayer comprises a number of inverters which have a combined time delay corresponding to the first delay time and the second delayer comprises another number of inverters which have a combined time delay corresponding to the second delay time.

9. The DLL circuit of claim 5, wherein when a phase difference between the first signal and the second signal is a first window, the size of the first window is equal to or smaller than ½ of the period of the external clock signal.

10. The DLL circuit of claim 5, wherein when a phase difference between the first signal and the third signal is a second window, the size of the second window is equal to or greater than the first cell delay time.

11. The DLL circuit of claim 5, wherein the phase detector further comprises a comparison signal generator generating one of the first comparison signal and the second comparison signal according to the logic levels of the first, second and third signals.

12. The DLL circuit of claim 11, wherein each of the first, second, and third comparators outputs a second logic level of a corresponding signal, when the corresponding signal has a first logic level at a rising edge of the external clock signal.

13. The DLL circuit of claim 12, wherein the phase detector generates the first comparison signal when the output signals of the first and third comparators have the second logic level and the output signal of the second comparator has the first logic level, and generates the second comparison signal when the output signals of the first, second and third comparators have the second logic level.

14. The DLL circuit of claim 12, wherein the phase detector outputs a fine lock enable signal for commanding a fine lock operation to be performed when the output signal of the first comparator has the second logic level and the output signals of the second and third comparators have the first logic level.

15. The DLL circuit of claim 5, wherein the delay circuit comprises:
   a delay chain comprising a plurality of delay cells connected in series and outputting a signal of an output node corresponding to a control signal, among output nodes between the delay cells adjacent to each other, as the internal clock signal; and
   a controller transferring the control signal to the delay chain in response to the comparison signal.

16. The DLL circuit of claim 15, wherein the controller comprises:
   the plurality of shift registers corresponding respectively to the delay cells and being connected in series;
   the first connections connecting the shift registers adjacent to each other; and
   the second connection connecting the shift registers spaced apart from each other.

17. The DLL circuit of claim 16, wherein the first connections comprise switches turned on in response to the first comparison signal, and the second connection comprises switches turned on in response to the second comparison signal.

18. The DLL circuit of claim 16, wherein the switches of the first connections are sequentially enabled in response to the first comparison signal.

19. The DLL circuit of claim 16, wherein the second connection connects the shift registers spaced apart from each other by a plurality of delay cells which cause the second cell delay time.

20. A semiconductor memory device comprising the DLL circuit of claim 1.

* * * * *